(12) United States Patent
Park

(10) Patent No.: US 7,018,935 B2
(45) Date of Patent: Mar. 28, 2006

(54) METHOD OF FORMING METAL LINE OF SEMICONDUCTOR DEVICE

(75) Inventor: Shin Seung Park, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 160 days.

(21) Appl. No.: 10/735,228

(22) Filed: Dec. 12, 2003

(65) Prior Publication Data
US 2004/0198059 A1    Oct. 7, 2004

(30) Foreign Application Priority Data
Apr. 3, 2003   (KR) ..................... 10-2003-0021058

(51) Int. Cl.
*H01L 21/302* (2006.01)

(52) U.S. Cl. ................. 438/720; 438/622; 438/706

(58) Field of Classification Search .............. 438/642, 438/622, 652, 629, 706, 710, 7
See application file for complete search history.

(56) References Cited

U.S. PATENT DOCUMENTS 5,747,369 A * 5/1998 Kantimahanti et al. ..... 438/241
6,656,826 B1 * 12/2003 Ishimaru .................... 438/612

* cited by examiner

*Primary Examiner*—Lan Vinh
(74) *Attorney, Agent, or Firm*—Marshall, Gerstein & Borun LLP

(57) ABSTRACT

Disclosed herein is a method of forming a metal line of a semiconductor device. The method includes forming a metal line connected to an underlying element by, for example, performing a main etching process and an over-etching process, at the same time, forming a metal fuse of which one side is connected to the metal line and the other side is connected to a semiconductor substrate. The method also includes forming the metal line of the semiconductor device by, for example, performing an over-etching process for isolating the metal line and the metal fuse electrically. Charges induced by plasma during the over-etching process for forming the metal line are accumulated in the metal line. According to the present invention, it is possible to minimize damage on the underlying element, since plasma-induced charges accumulated in the metal line are discharged into the semiconductor substrate through the metal fuse.

6 Claims, 6 Drawing Sheets

METHOD OF FORMING METAL LINE OF SEMICONDUCTOR DEVICE

BACKGROUND

1. Field of the Invention

The present invention relates to a method of forming a metal line of a semiconductor device, and more specifically to a method of forming a metal line of a semiconductor device capable of minimizing damage on an underlying element due to plasma-induced charges accumulated in the metal line in an over-etching process during forming the metal line connected to the underlying element.

2. Discussion of Related Art

Generally, a metal line is connected to an underlying element by carrying out a main etching process and an over-etching process using a plasma etching method after depositing a metal layer. During the process of forming the metal line, charges induced by plasma are accumulated in the metal line, which serve as a charging antenna, whereby the charges accumulated in the metal line damage the underlying element.

FIGS. 1A to 1F are cross-sectional views illustrating a conventional method of forming a metal line of a semiconductor device.

Referring to FIG. 1A, an underlying element 11 is formed on a semiconductor substrate 10. The underlying element 11 includes all unit elements employed in the present invention.

Referring to FIG. 1B, an interlayer insulating film 12 is formed on the semiconductor substrate 10 including the underlying element 11. A metal line contact hole 13 is formed by etching a portion of the interlayer insulating film 12 to expose a portion of a top surface of the underlying element 11.

Referring to FIG. 1C, conductive materials fill an inner portion of the metal line contact hole 13, so that a metal line plug 14 is formed to be connected to the underlying element 11.

Referring to FIG. 1D, a metal layer 15 is formed on the interlayer insulating film 12 including the metal line plug 14. A photoresist pattern 16 is formed on the metal layer 15 to cover a portion, in which the metal line is formed, including a top surface of the metal line plug 14.

Referring to FIG. 1E, a main etching process is carried out using a plasma etching method to etch the exposed portion of the metal layer 15.

Referring to FIG. 1F, the metal line 150 connected to the metal plug 14 is formed by carrying out an over-etching process for eliminating the metal layer 15, which remains even after performing the main etching process.

In processes mentioned above, charges induced by plasma during the main etching process using the plasma etching method are accumulated in the metal layer 15. In the main etching process, the plasma-induced charges do not damage the underlying element because the metal layer 15 on a wafer is electrically connected, not isolated. However, since the metal line 150 formed by the over-etching process is completely isolated not electrically connected, the metal line 150 serves as a charging antenna, so that the charges accumulated in the metal line 150 during the main etching process and the over-etching process electrically damage the underlying element 11 to deteriorate reliability thereof. When a multi-layer metal line is formed, damage on the underlying element 11 due to the charges is significantly increased because the aforementioned plasma damage is repeatedly accumulated.

Damage on the underlying element 11 due to the plasma-induced charges is affected by a layout of an antenna structure of the metal line 150, which is disclosed in Journal of the Korean Physical Society, Vol. 35, December 1999, pp. S742 to S746, entitled "Effect of Plasma Induced Charging in Interconnect Metal Etch on the Characteristics of a Ferroelectric Capacitor".

SUMMARY OF THE INVENTION

Accordingly, the present invention is directed to provide a method of forming a metal line of a semiconductor device, capable of improving electrical efficiency and reliability of the semiconductor device by minimizing damage on an underlying element connected to the metal line due to plasma-induced charges accumulated in the metal line during forming the metal line.

One aspect of the present invention is to provide a method of forming a metal line of a semiconductor device, comprising the steps of: preparing a semiconductor substrate comprising an underlying element and forming an interlayer insulating film thereon; forming a metal line contact hole to expose a portion of the underlying element, and a metal fuse contact hole to expose a portion of the semiconductor device by etching a portion of the interlayer insulating film; forming a metal line plug and a metal fuse plug by filling the metal line contact hole and the metal fuse contact hole with conductive materials, respectively; forming a metal layer on the interlayer insulating film including the metal line plug and the metal fuse plug; forming a metal line pattern and a metal fuse pattern electrically connected to the metal line pattern by etching the metal layer by, for example, means of a main etching process and an over-etching process for forming the metal line; and forming the metal line by electrically isolating the metal line pattern and the metal fuse pattern by means of the over-etching process to the metal fuse.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Now, preferable embodiments according to the present invention will be described in detail with reference to the appended drawings. However, the present invention is not limited to the embodiments disclosed in the following description, but can be implemented into various changes and modifications. Thus, these embodiments according to the present invention are intended to completely inform those skilled in the art of a scope of the present invention.

FIGS. 2A to 2G are cross-sectional views illustrating a method of forming a metal line of a semiconductor device according to an embodiment of the present invention.

Figure 1A:
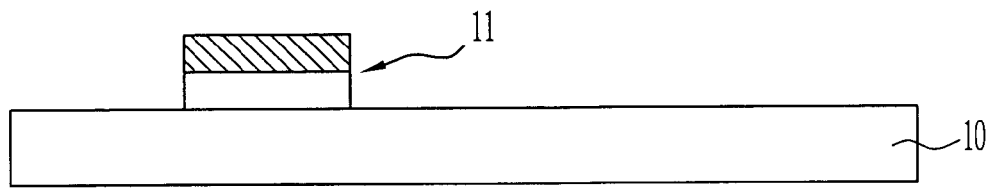
FIGS. 1A to 1F are cross-sectional views illustrating a conventional method of forming a metal line of a semiconductor device; and, FIGS. 2A to 2G are cross-sectional views illustrating a method of forming a metal line of a semiconductor device according to an embodiment of the present invention.
Figure 1B:
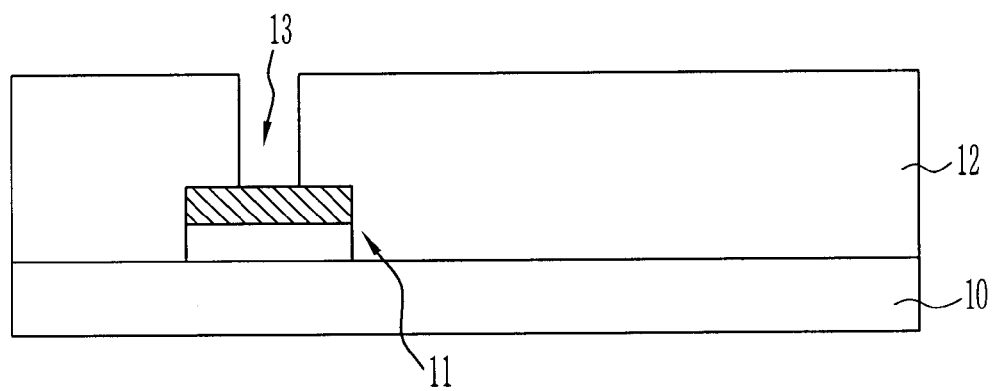
Figure 1C:
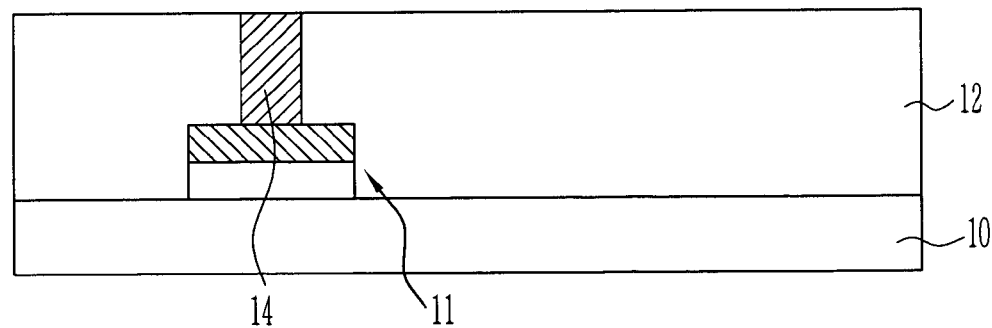
Figure 1D:
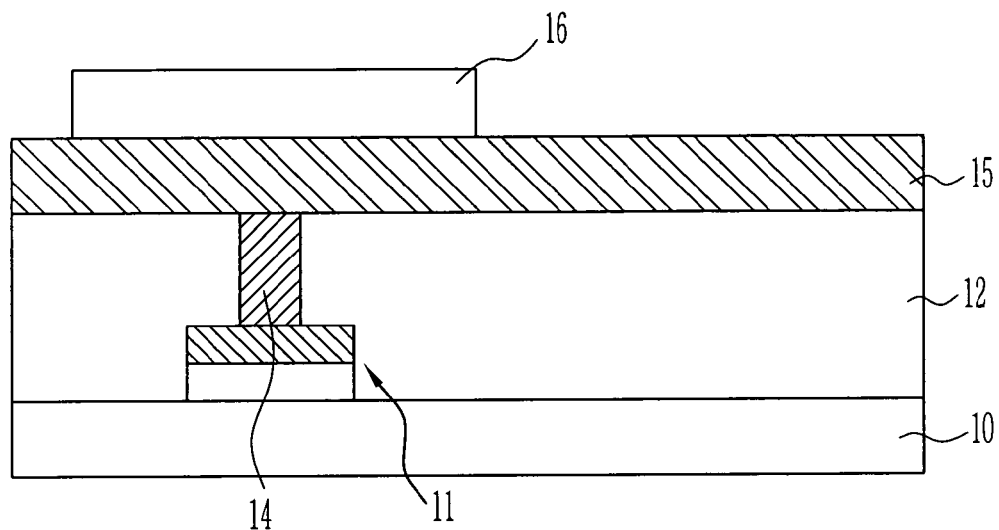
Figure 1E:
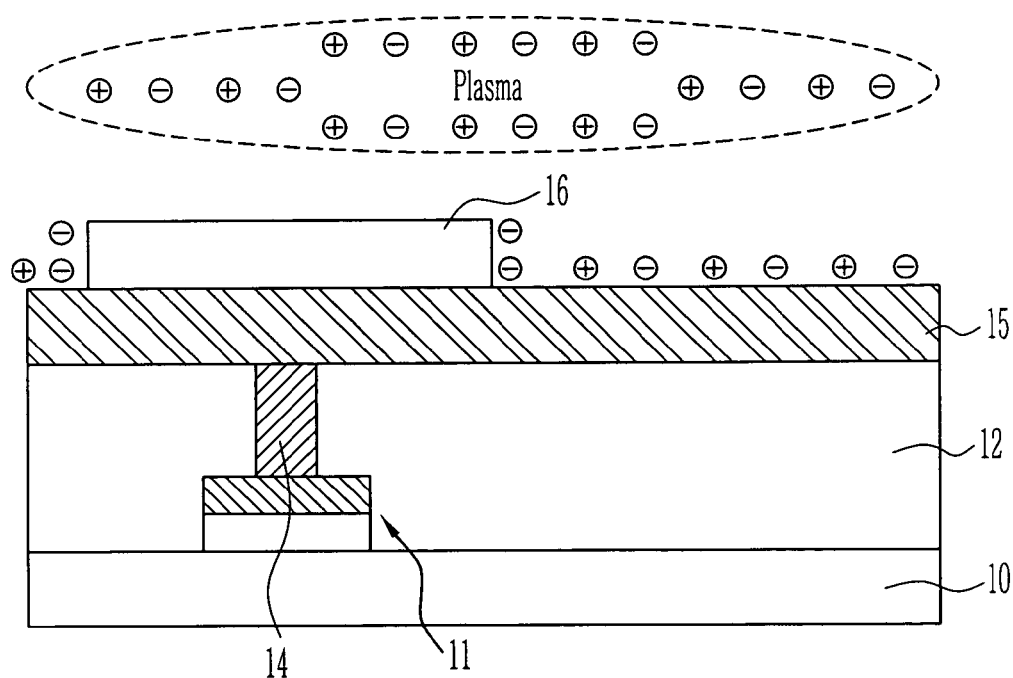
Figure 1F:
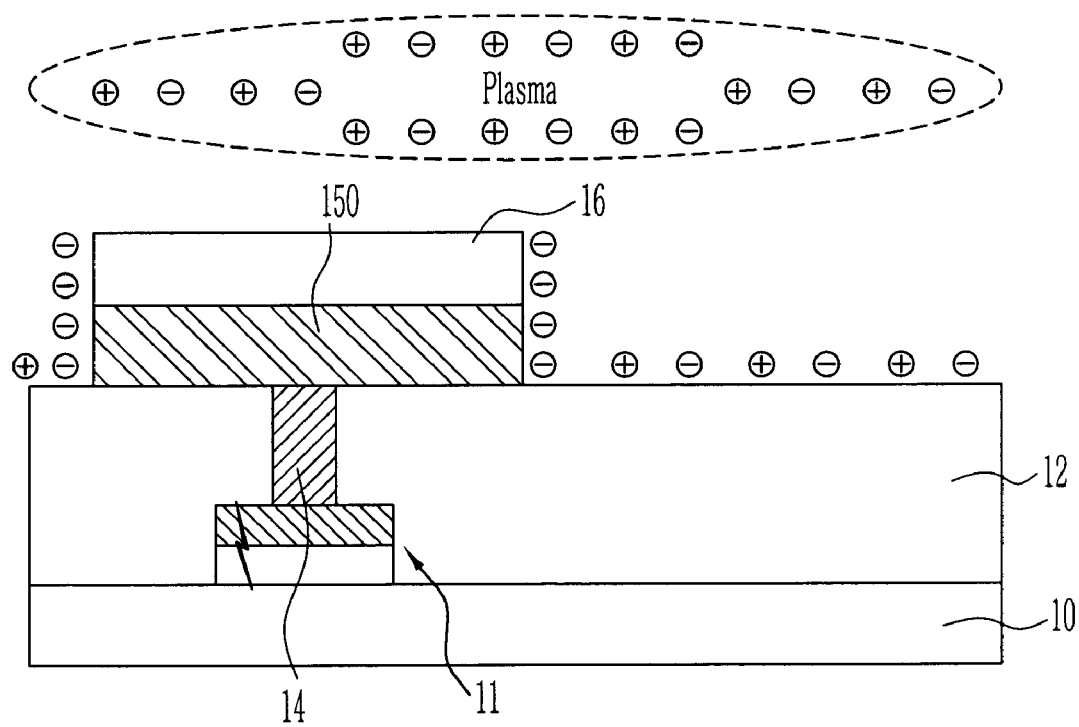
Figure 2A:
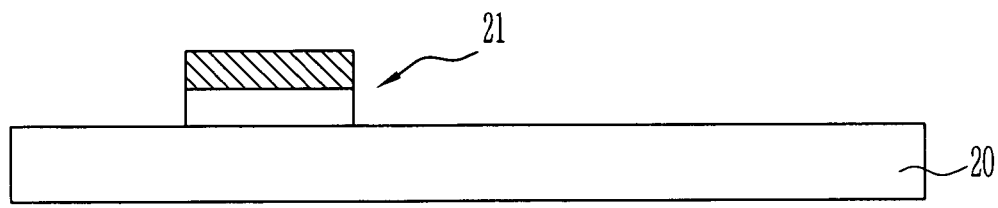

Referring to FIG. 2A, an underlying element 21 is formed on a semiconductor substrate 20. The underlying element 21 includes all unit elements employed in the semiconductor device.

Figure 2B:
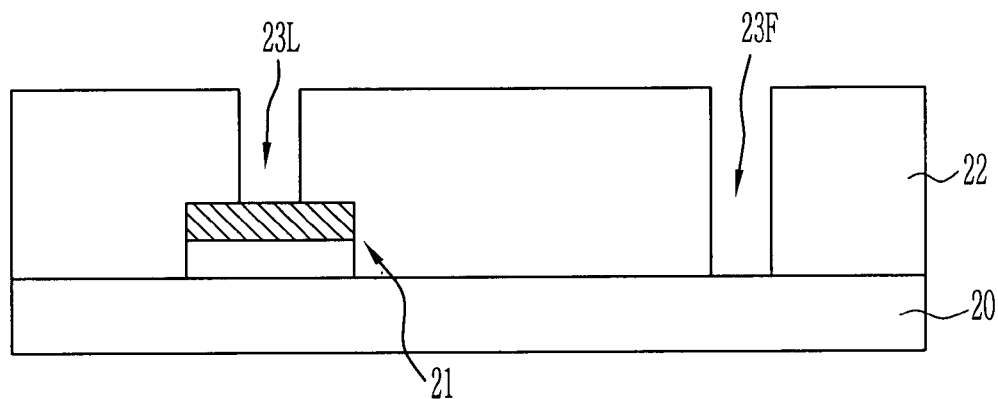

Referring to FIG. 2B, an interlayer insulating film 22 is formed on the semiconductor substrate 20 including the underlying element 21. A metal line contact hole 23L for exposing a portion of a top surface of the underlying element 21 and a metal fuse contact hole 23F for exposing a portion of the semiconductor substrate 20 are formed by etching a portion of the interlayer insulating film 22, respectively.

Figure 2C:
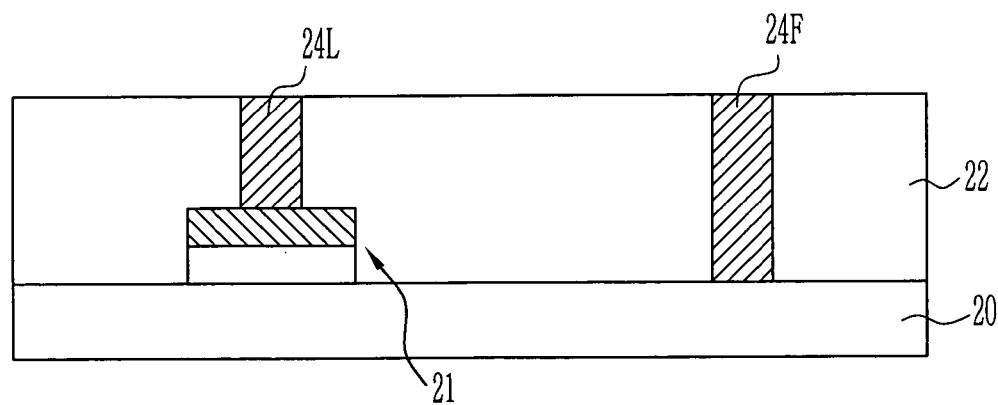

Referring to FIG. 2C, a metal line plug 24L connected to the underlying element 21 and a metal fuse plug 24F connected to the semiconductor substrate 20 are formed by filling the metal line contact hole 23L and the metal fuse contact hole 23F with conductive materials, respectively.

Figure 2D:
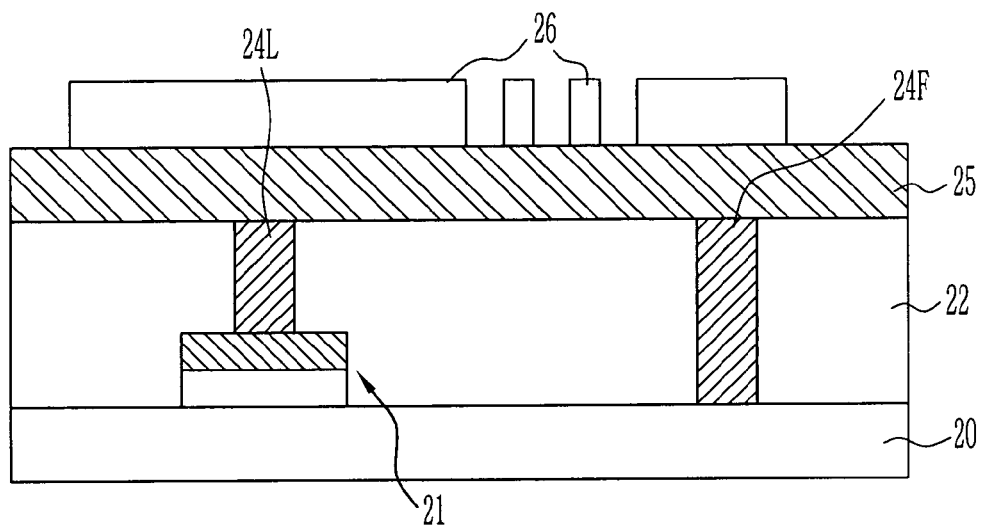

Referring to FIG. 2D, a metal layer 25 is formed on the interlayer insulating film 22 including the metal line plug 24L and the metal fuse plug 24F. A photoresist pattern 26 is formed on the metal layer 25. The photoresist pattern 26 is formed to cover a metal line area including the metal line plug 24L and a metal fuse area including the metal fuse plug 24F and to have a narrow space between the metal line area and the metal fuse area where etch loading effect is exhibited at the time of performing a main etching process and an over-etching process for forming the metal line. On the other hand, the photoresist pattern 26 formed in the metal fuse area may be multiple patterns. At that time, spaces between the multiple patterns must be narrow enough to exhibit etch loading effect.

Figure 2E:
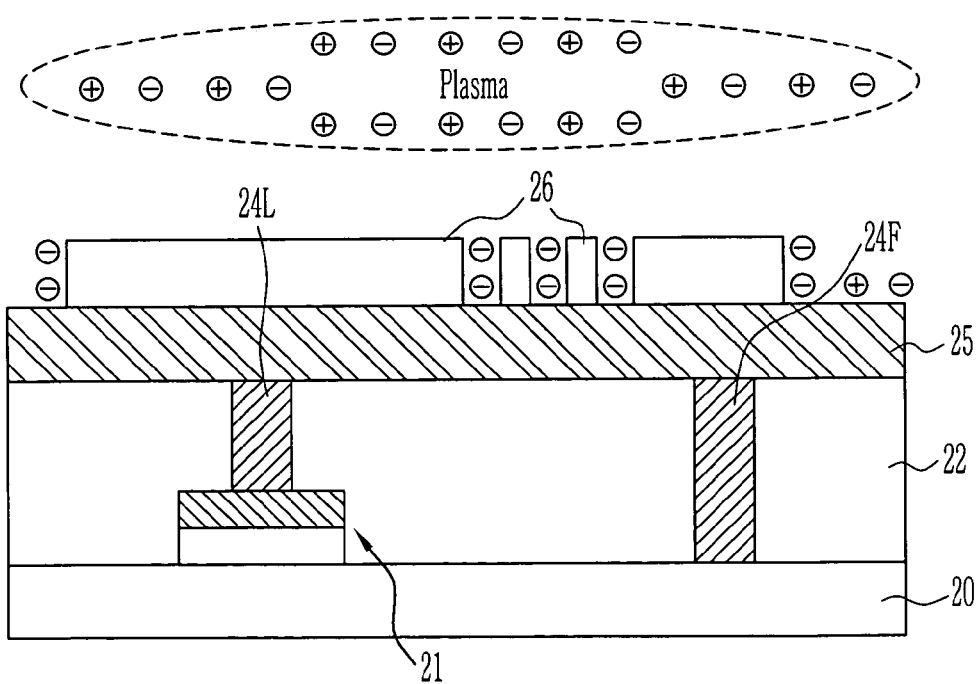

Referring to FIG. 2E, in order to etch the exposed portions of the metal layer 25, the main etching process using the plasma etching method is carried out.

Figure 2F:
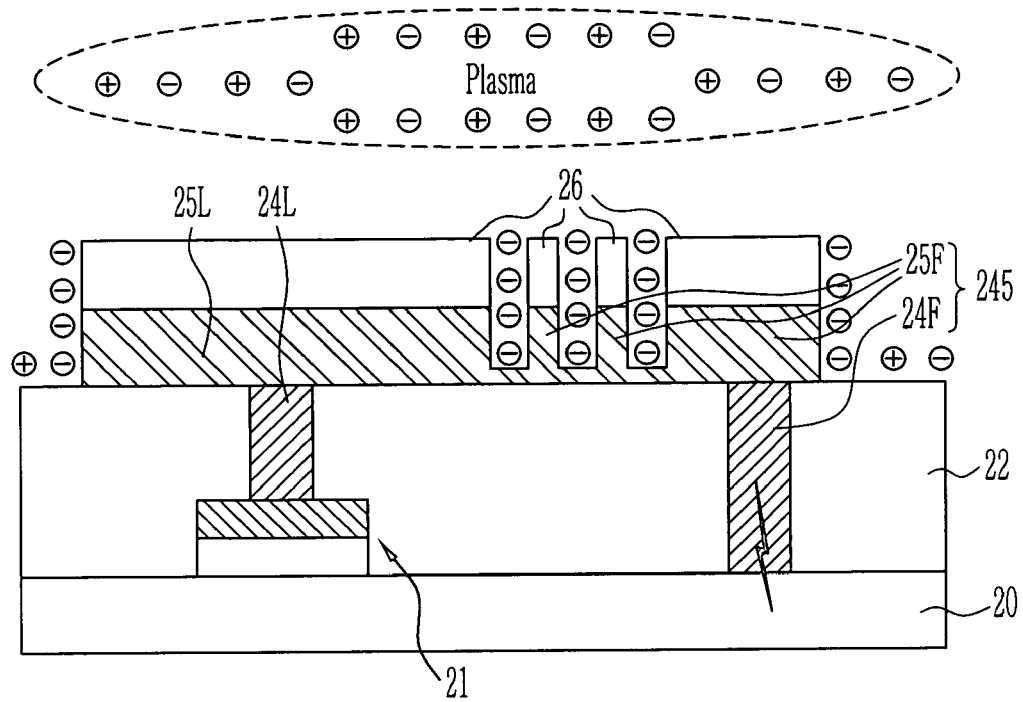

Referring to FIG. 2F, the over-etching process is carried out to eliminate the metal layer 25, which remains even after performing the main etching process, whereby a metal line pattern 25F connected to the metal line plug 24L is formed and at least one metal fuse pattern 25F connected to the metal fuse plug 24F is formed. Space between the metal line pattern 25L and the metal fuse pattern 25F is set such that the metal layer 25 having a constant thickness remains in the space even after performing the over-etching process, due to etch loading effect. Thus, the metal line pattern 25L and the metal fuse pattern 25F is electrically connected to each other. Further, where there are a plurality of metal fuse patterns 25F, the metal fuse patterns 25F are densely formed and the metal layer 25 having a constant thickness between the patterns remains, so that the metal fuse patterns 25F are electrically connected to each other. Therefore, the underlying element 21, the metal line plug 24L, a metal line pattern 24F, the metal fuse pattern 25F, the metal fuse plug 24F and the semiconductor substrate 20 are electrically connected sequentially. At this time, the metal fuse plug 24F and at least one metal fuse pattern 25F serves as a metal fuse 245.

Figure 2G:
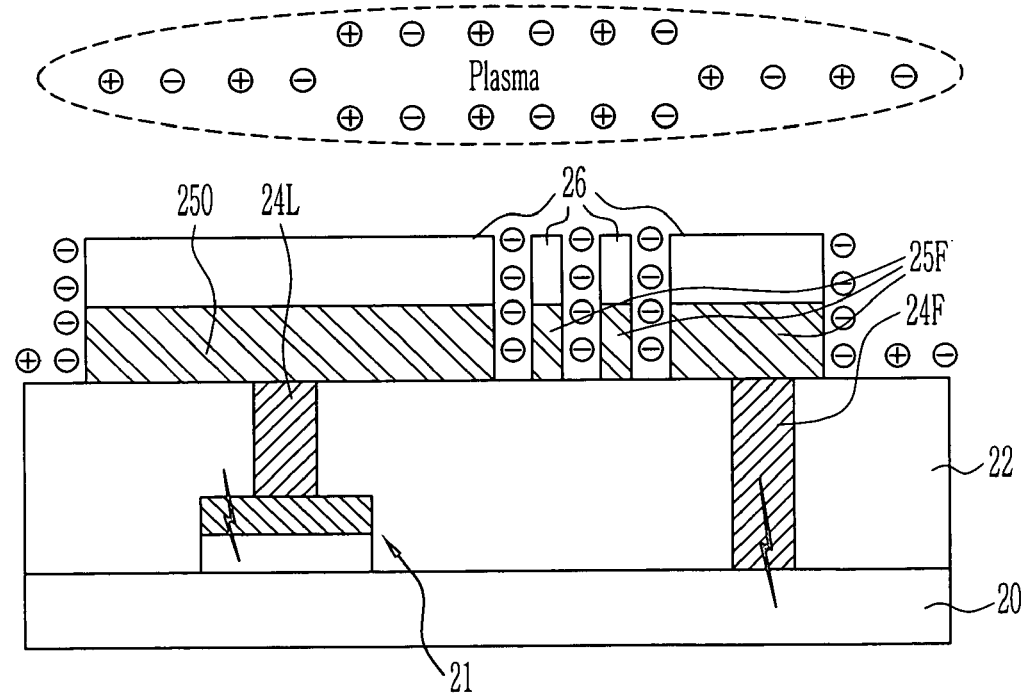

Referring to FIG. 2G, the over-etching process to the metal fuse is carried out to eliminate the metal layer 25, which remains on the periphery of the metal fuse pattern 25F, so that the metal fuse 245 and a metal line 250 electrically isolated from the metal fuse are formed.

In the aforementioned processes, charges induced by plasma during the main etching process using the plasma etching method of forming the metal line 250 are accumulated in the metal layer 25. In the main etching process, since the metal layer 25 on a wafer is electrically connected, not completely isolated, the plasma-induced charges do not damage the underlying element 21 (see FIG. 2E). The metal line pattern 25L formed in the over-etching process following the main etching process is isolated from an adjacent metal line pattern (not shown), while one side of the metal line pattern 25L is connected to the metal fuse 245, as shown in FIG. 2F, so that the charges accumulated in the metal line pattern 25L during the main etching process and the over-etching process are discharged into the semiconductor substrate 21 through the metal fuse 245. Accordingly, the plasma-induced charges do not damage the underlying element 21. As shown in FIG. 2G, the plasma-induced charges are accumulated in the metal line 250 and the metal fuse 245 during the over-etching process for the metal fuse and plasma-induced charges can damage the underlying element 21. However, the level of damaging is not significant compared to the conventional method of forming a metal line. In other words, in the conventional method, the accumulated charges damage the underlying element during the main etching process and the over-etching process for forming the metal line, but in the method according to the present invention, the over-etching process for the metal fuse, only. Therefore, the damage due to the charges is insignificant.

Although, a structure of a single layer metal line is described in the embodiment of the present invention, it is possible to minimize damage of the underlying element due to the plasma-induced charges by forming a multi-layer metal line using the same method. When a principle of the present invention applies to the multi layer metal line, there are more or less differences in components, for example, another metal line is formed on the metal line 250 of FIG. 2G and another metal fuse is formed on the metal fuse of FIG. 2G or the like, but the multi layer metal line can be easily implemented by those skilled in the art. Accordingly, the present invention is not limited to the embodiment described referring to the appended drawings, but includes all the methods of forming a metal line of a semiconductor device, capable of employing the principle of the present invention.

As described above, according to the present invention, when the metal line is formed, the metal fuse connected to the metal line and the semiconductor substrate is formed at the same time, so that the plasma-induced charges accumulated in the metal line during the process of forming the metal line are discharged into the semiconductor substrate through the metal fuse. Therefore, it is possible to improve electrical efficiency and reliability of the element by minimizing damage to the underlying element connected to the metal line.

What is claimed is:

1. A method of forming a metal line of a semiconductor device, comprising the steps of:
   (a) preparing a semiconductor substrate comprising an underlying element and forming an interlayer insulating film thereon;
   (b) forming a metal line contact hole to expose a portion of the underlying element, and a metal fuse contact hole to expose a portion of the semiconductor substrate by etching a portion of the interlayer insulating film;
   (c) forming a metal line plug and a metal fuse plug by filling the metal line contact hole and the metal fuse contact hole with conductive materials, respectively;
   (d) forming a metal layer on the interlayer insulating film including the metal line plug and the metal fuse plug;
   (e) forming a photoresist pattern covered a metal line area including the metal line plug and a metal fuse area including the metal line plug, the photoresist pattern having at least one space between the metal line area and the metal fuse area;

(f) etching the metal layer to form a metal line pattern and a metal fuse pattern, the metal line remains thinner than the metal line pattern at the space due to an etch loading effect, and the metal line pattern and the metal fuse plug being electrically connected to each other; and (g) performing an over-etching process of the metal fuse to remove the remaining metal layer at the space so that the metal line pattern and the metal fuse pattern are isolated each other.

2. The method of claim 1, wherein the metal line pattern is connected to the underlying element through the metal line plug.

3. The method of claim 1, wherein the metal fuse pattern is connected to the semiconductor substrate through the metal fuse plug.

4. The method of claim 1, wherein the space between the metal line pattern and the metal fuse pattern is set to have a width such that the metal layer remains to a constant thickness in the space due to the etching loading effect, even after carrying out the over-etching process of forming the metal line.

5. The method of claim 1, wherein the metal fuse pattern comprises a plurality of condensed patterns, and spaces between the condensed patterns are set to have widths such that the metal layer has a constant thickness in the spaces due to the etch loading effect, even after etching the metal layer.

6. The method of claim 1, wherein the etching step (f) is performed by an etch process and over-etch process.

* * * * *

UNITED STATES PATENT AND TRADEMARK OFFICE
CERTIFICATE OF CORRECTION

PATENT NO. : 7,018,935 B2  
APPLICATION NO. : 10/735228  
DATED : March 28, 2006  
INVENTOR(S) : Shin Seung Park Page 1 of 1

It is certified that error appears in the above-identified patent and that said Letters Patent is hereby corrected as shown below:

Col. 4, line 63: Please delete "covered" and insert --covering-- therefor.

Col. 5, line 9: Please delete "isolated each" and insert --isolated from each-- therefor.

Signed and Sealed this

Twenty-fifth Day of March, 2008

JON W. DUDAS  
*Director of the United States Patent and Trademark Office*